(12) United States Patent
Hung et al.

(10) Patent No.: US 10,074,637 B2
(45) Date of Patent: Sep. 11, 2018

(54) STRUCTURE AND FORMATION METHOD FOR CHIP PACKAGE

(71) Applicant: Taiwan Semiconductor Manufacturing Company, Ltd., Hsinchu (TW)

(72) Inventors: Jui-Pin Hung, Hsinchu (TW); Cheng-Lin Huang, Hsinchu (TW); Hsien-Wen Liu, Hsinchu (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/458,378

(22) Filed: Mar. 14, 2017

(65) Prior Publication Data

US 2017/0186736 A1 Jun. 29, 2017

Related U.S. Application Data

(63) Continuation of application No. 14/881,840, filed on Oct. 13, 2015, now Pat. No. 9,595,510.

(51) Int. Cl.
*H01L 23/00* (2006.01)
*H01L 25/10* (2006.01)
(Continued)

(52) U.S. Cl.
CPC .......... *H01L 25/105* (2013.01); *H01L 21/561* (2013.01); *H01L 21/568* (2013.01); *H01L 24/19* (2013.01); *H01L 24/20* (2013.01); *H01L 24/97* (2013.01); *H01L 25/0657* (2013.01); *H01L 25/50* (2013.01); *H01L 23/10* (2013.01); *H01L 2224/04105* (2013.01); *H01L 2224/12105* (2013.01); *H01L 2224/19* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01);
(Continued)

(58) Field of Classification Search
CPC ..................................................... H01L 25/105
See application file for complete search history.

(56) References Cited

U.S. PATENT DOCUMENTS 8,941,244 B1 1/2015 Tsai et al.
2003/0228767 A1 12/2003 Tanaka
(Continued)

FOREIGN PATENT DOCUMENTS

CN 1438691 A 8/2003
CN 1474439 A 2/2004
(Continued)

*Primary Examiner* — William Harriston
(74) *Attorney, Agent, or Firm* — Slater Matsil, LLP

(57) ABSTRACT

Structures and formation methods of a chip package are provided. The chip package includes a semiconductor die and a package layer partially or completely encapsulating the semiconductor die. The chip package also includes a conductive feature penetrating through the package layer. The chip package further includes an interfacial layer the interfacial layer continuously surrounds the conductive feature. The interfacial layer is between the conductive feature and the package layer, and the interfacial layer is made of a metal oxide material.

20 Claims, 20 Drawing Sheets

(51) Int. Cl.
    *H01L 25/00*       (2006.01)
    *H01L 21/56*       (2006.01)
    *H01L 25/065*     (2006.01)
    *H01L 23/10*       (2006.01)

(52) U.S. Cl.
    CPC ............. *H01L 2224/92244* (2013.01); *H01L 2224/97* (2013.01); *H01L 2225/0651* (2013.01); *H01L 2225/06548* (2013.01); *H01L 2225/06568* (2013.01); *H01L 2225/1035* (2013.01); *H01L 2225/1041* (2013.01); *H01L 2225/1058* (2013.01)

(56) References Cited

U.S. PATENT DOCUMENTS

| | | | |
|---|---|---|---|
| 2004/0038526 A1 | 2/2004 | Liu et al. | |
| 2007/0262432 A1 | 11/2007 | Otremba | |
| 2011/0049705 A1* | 3/2011 | Liu | H01L 24/11 257/737 |
| 2011/0233754 A1 | 9/2011 | Meyer-Berg | |
| 2011/0285015 A1 | 11/2011 | Song et al. | |
| 2014/0210101 A1 | 7/2014 | Lin et al. | |
| 2015/0008586 A1* | 1/2015 | Tsai | H01L 21/486 257/774 |
| 2015/0130070 A1 | 5/2015 | Lin et al. | |
| 2015/0145142 A1 | 5/2015 | Lin et al. | |
| 2015/0380374 A1 | 12/2015 | Nakamura et al. | |

FOREIGN PATENT DOCUMENTS

| | | |
|---|---|---|
| CN | 104282580 A | 1/2015 |
| CN | 104658989 A | 5/2015 |
| WO | 2014203798 A1 | 12/2014 |

* cited by examiner

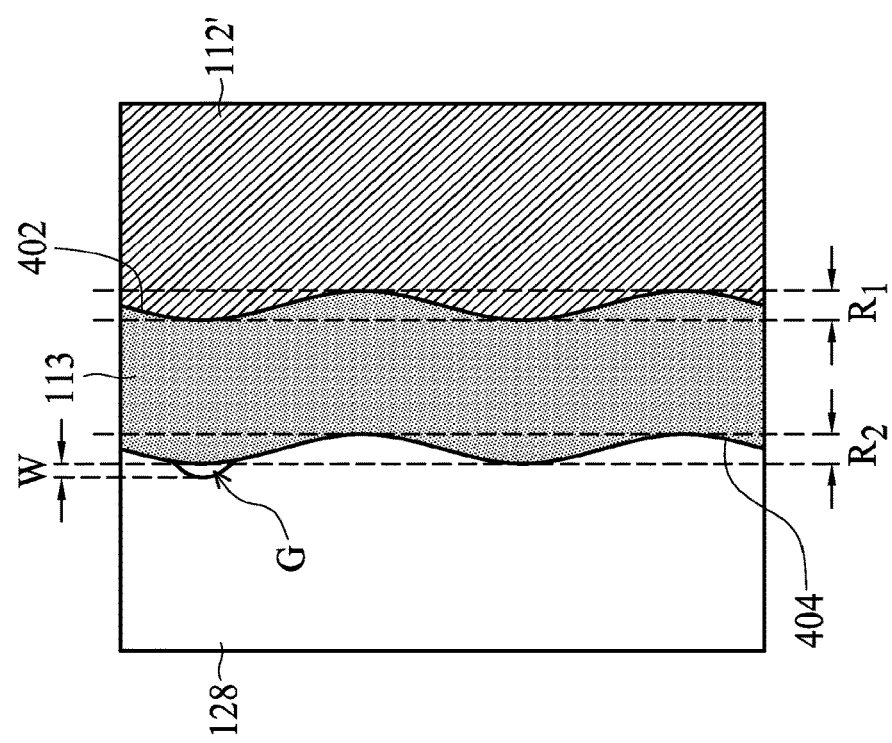

STRUCTURE AND FORMATION METHOD FOR CHIP PACKAGE

PRIORITY CLAIM AND CROSS-REFERENCE

This application claims the benefit to and is a continuation of U.S. patent application Ser. No. 14/881,840, filed on Oct. 13, 2015, and entitled "Structure and Formation Method for Chip Package" which application is incorporated herein by reference.

BACKGROUND

Semiconductor devices are used in a variety of electronic applications, such as personal computers, cell phones, digital cameras, and other electronic equipment. These semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate.

The semiconductor industry continues to improve the integration density of various electronic components (e.g., transistors, diodes, resistors, capacitors, etc.) by continual reductions in minimum feature size, which allow more components to be integrated into a given area. These smaller electronic components also use a smaller package that utilizes less area or a smaller height, in some applications.

New packaging technologies, such as package on package (PoP), have begun to be developed, in which a top package with a device die is bonded to a bottom package, with another device die. By adopting the new packaging technologies, various packages with different or similar functions are integrated together. These relatively new types of packaging technologies for semiconductor devices face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 5 is a cross-sectional view of a portion of a chip package, in accordance with some embodiments.

DETAILED DESCRIPTION

Figure 1A:
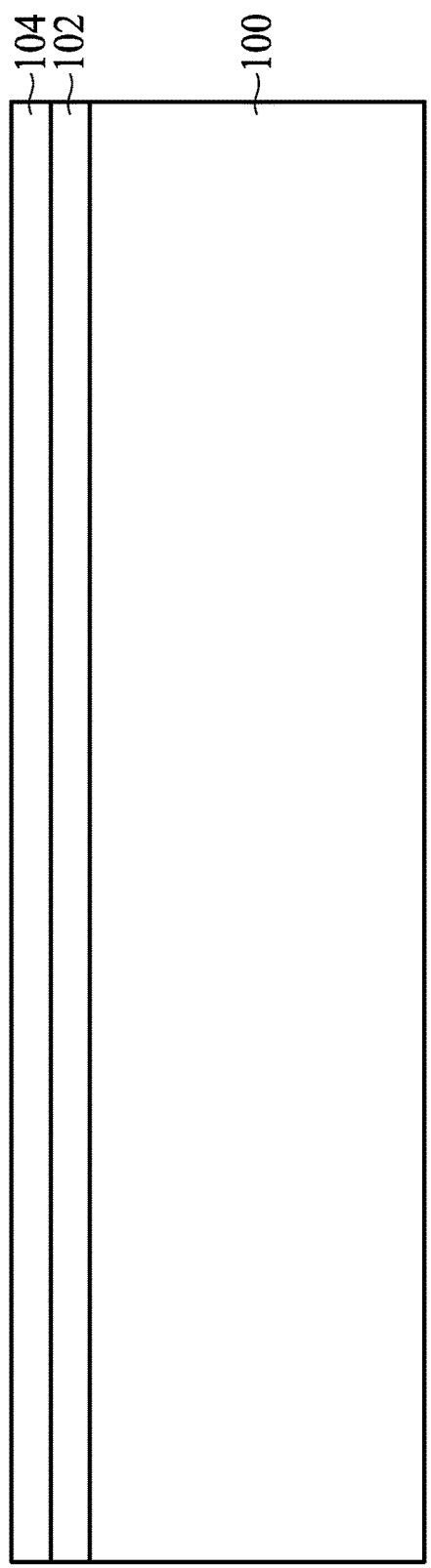
FIGS. 1A-1N are cross-sectional views of various stages of a process for forming a chip package, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1N are cross-sectional views of various stages of a process for forming a chip package, in accordance with some embodiments. Additional operations can be provided before, during, and/or after the stages described in FIGS. 1A-1N. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As shown in FIG. 1A, an adhesive layer 102 and a base layer 104 are sequentially deposited or laminated over a carrier substrate 100, in accordance with some embodiments. In some embodiments, the carrier substrate 100 is used as a temporary support substrate. The carrier substrate 100 may be made of a semiconductor material, ceramic material, polymer material, metal material, another suitable material, or a combination thereof. In some embodiments, the carrier substrate 100 is a glass substrate. In some other embodiments, the carrier substrate 100 is a semiconductor substrate, such as a silicon wafer.

The adhesive layer 102 may be made of glue, or may be a lamination material, such as a foil. In some embodiments, the adhesive layer 102 is photosensitive and is easily detached from the carrier substrate 100 by light irradiation. For example, shining ultra-violet (UV) light or laser light on the carrier substrate 100 is used to detach the adhesive layer 102. In some embodiments, the adhesive layer 102 is a light-to-heat-conversion (LTHC) coating. In some other embodiments, the adhesive layer 102 is heat-sensitive.

In some embodiments, the base layer 104 is a polymer layer or a polymer-containing layer. The base layer 104 may be a poly-p-phenylenebenzobisthiazole (PBO) layer, a polyimide (PI) layer, a solder resist (SR) layer, an Ajinomoto buildup film (ABF), a die attach film (DAF), another suitable layer, or a combination thereof.

Figure 1B:
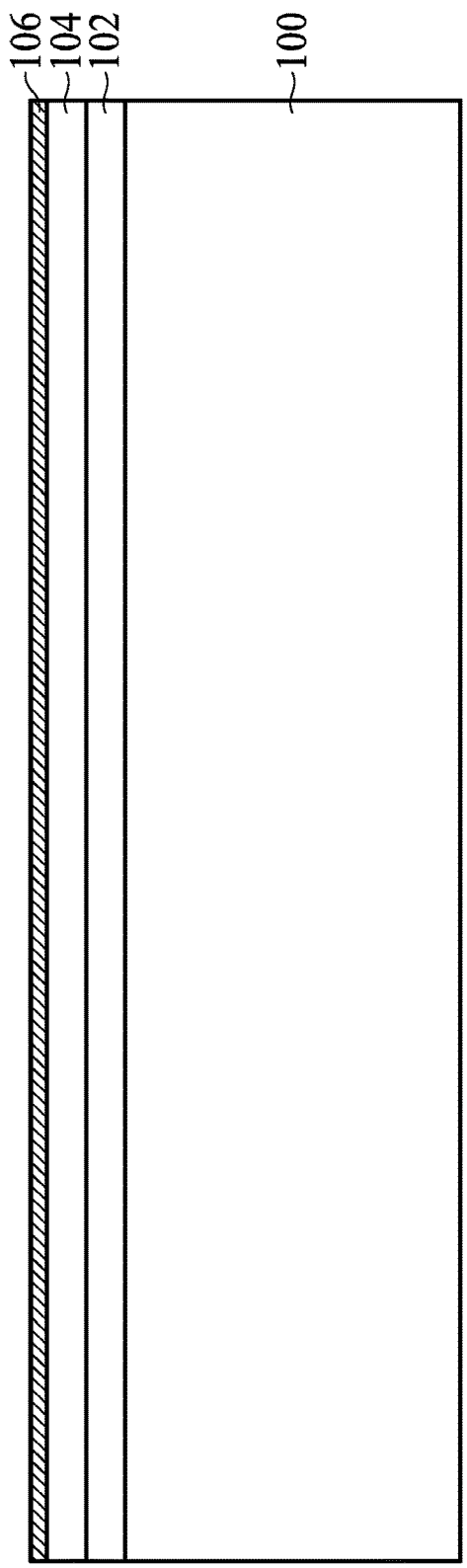

Afterwards, a seed layer 106 is deposited over the base layer 104, as shown in FIG. 1B in accordance with some embodiments. In some embodiments, the seed layer 106 is made of copper. In some embodiments, the seed layer 106 is deposited using a physical vapor deposition (PVD) process, a chemical vapor deposition (CVD) process, another applicable process, or a combination thereof. However, embodiments of the disclosure are not limited thereto. Other conductive films may also be used as the seed layer 106. For example, the seed layer 106 may be made of Ti, Ti alloy, Cu, Cu alloy, or a combination thereof. The Ti alloy or the Cu alloy may include silver, chromium, nickel, tin, gold, tungsten, another suitable element, or a combination thereof.

Figure 1C:
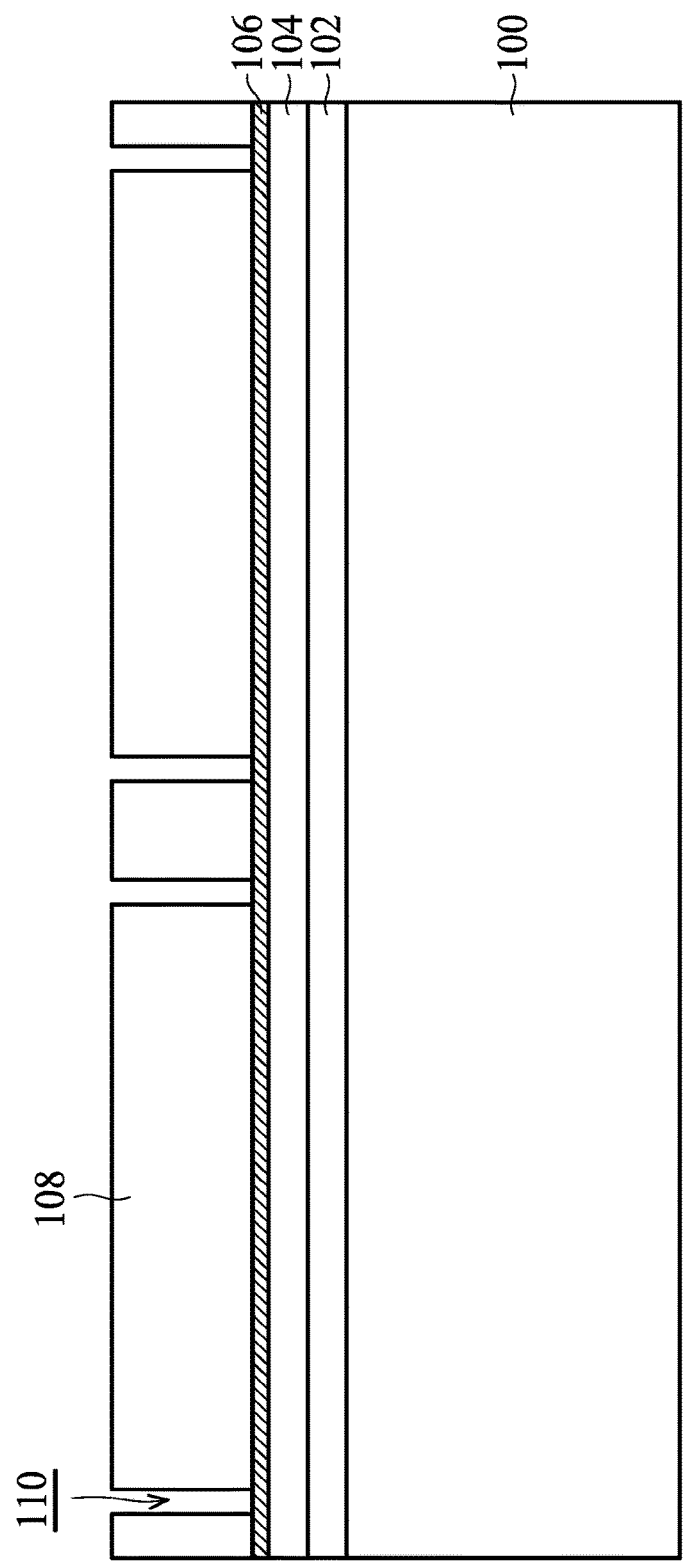

As shown in FIG. 1C, a mask layer 108 is formed over the seed layer 106, in accordance with some embodiments. The mask layer 108 has one or more openings 110 that expose a portion of the seed layer 106. The openings of the mask layer 108 define the positions where conductive features, such as through package vias, are designed to be formed. In some embodiments, the mask layer 108 is made of a photoresist material. The openings of the mask layer 108 may be formed by a photolithography process. The photolithography process may include exposure and development processes.

Figure 1D:
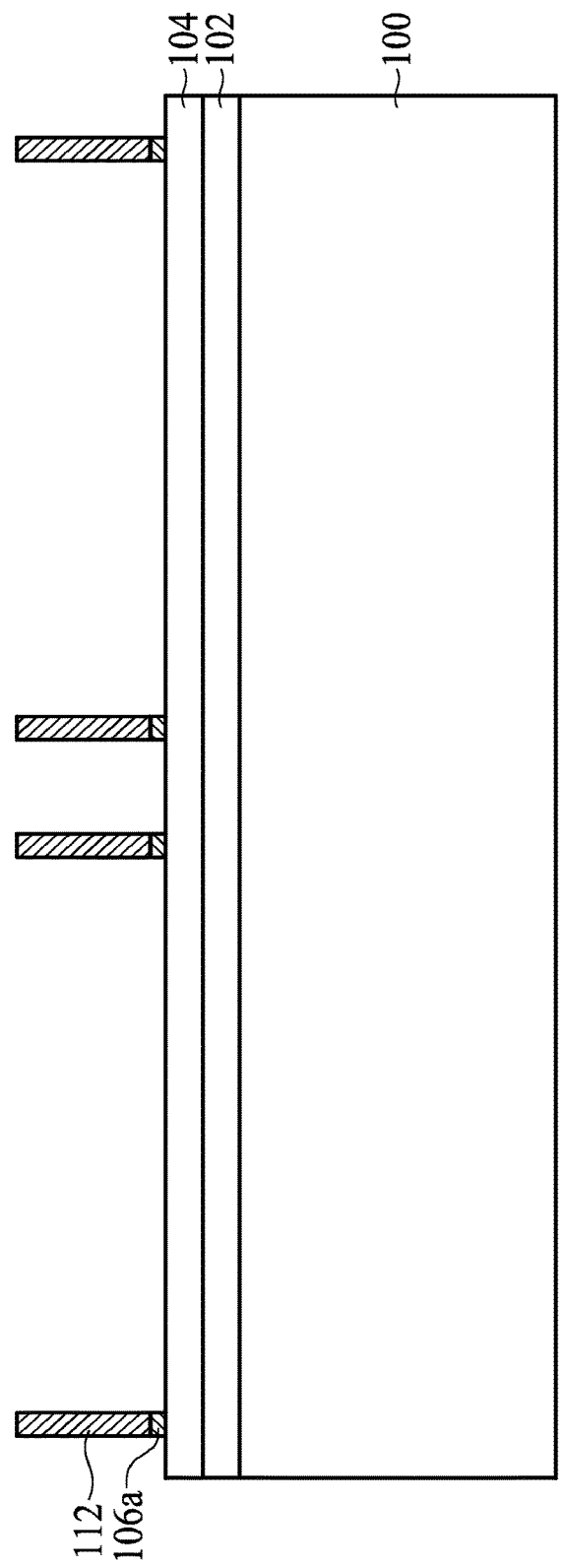

Afterwards, conductive features 112 are formed, the mask layer 108 is removed, and the seed layer 106 is patterned to form seed elements 106a, as shown in FIG. 1D in accordance with some embodiments. In some embodiments, a conductive material is deposited over the exposed portions of the seed layer 106 to completely or partially fill the openings 110. The conductive material may include copper. Afterwards, the mask layer 108 is removed, and the deposited conductive material forms multiple conductive features 112 (or conductive pillars), as shown in FIG. 1D. The conductive features 112 may be used as mask elements during a subsequent etching of the seed layer 106. As a result, the seed layer 106 is patterned to form the seed elements 106.

Figure 1E:
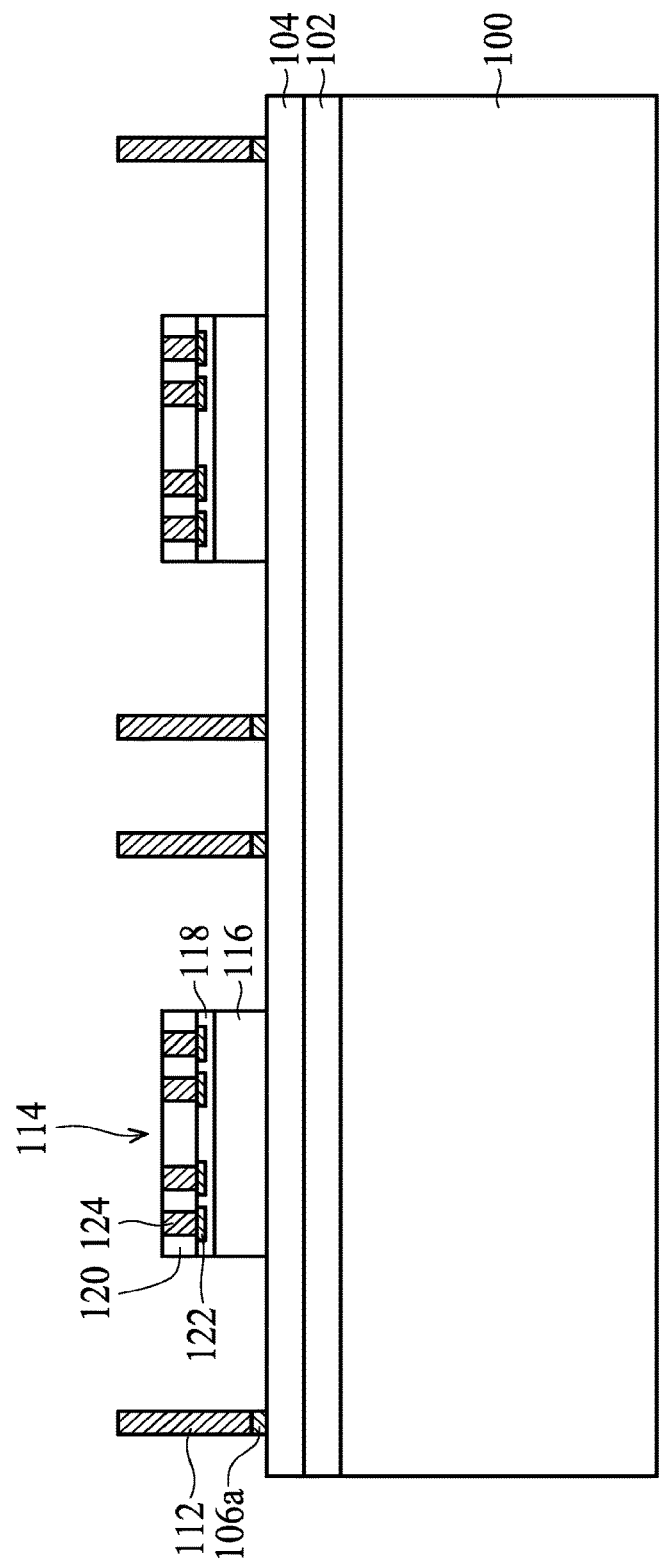

As shown in FIG. 1E, semiconductor dies 114 are attached on the base layer 104, in accordance with some embodiments. In some embodiments, the back sides of the semiconductor dies 114 face the base layer 104 with the front sides of the semiconductor dies 114 facing upwards. Each of the semiconductor dies 114 may include a semiconductor substrate 116, a passivation layer 118, conductive pads 122, a protection layer 120, and connectors 124 at the front side of the semiconductor die. A variety of device elements may be formed in or over the semiconductor substrate 116. The device elements may include active devices and/or passive devices. An adhesive film, such as a die attach film (DAF), (not shown) may be used between the semiconductor dies 114 and the base layer 104.

Figure 1F:
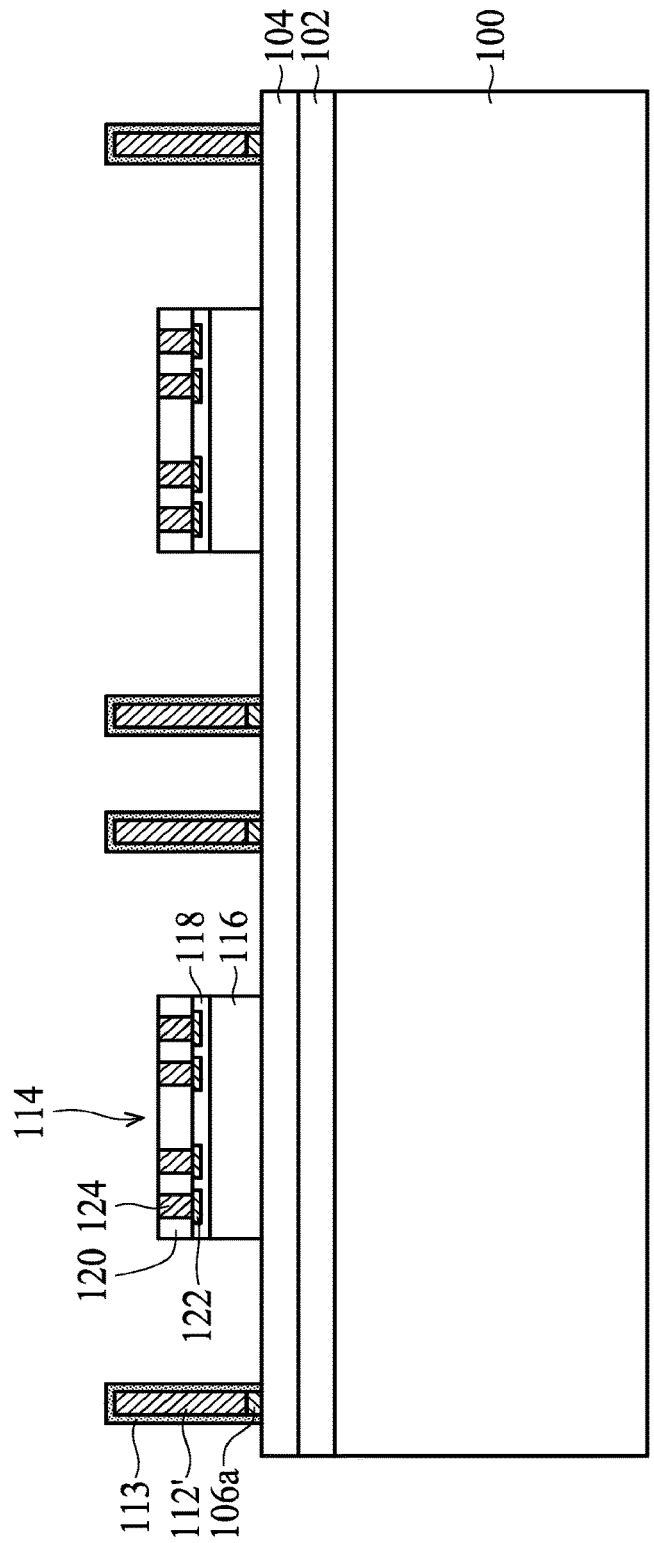

As shown in FIG. 1F, the conductive features 112 are heated to form conductive features 112', in accordance with some embodiments. In some embodiments, the heating operation induces grain growth of the grains in the conductive features 112, causing the formation of the conductive features 112'. In some embodiments, the average gram size of the conductive feature 112 is in a range from about 220 µm to about 240 µm. In some embodiments, the average grain size of the conductive features 112' is increased to be in a range from about 270 µm to about 290 µm. In some embodiments, the average grain size of the conductive features 112' is increased to be in a range from about 250 µm to about 320 µm.

In some embodiments, the heating operation is performed at a temperature in a range from about 200 degrees C. to about 250 degrees C. In some other embodiments, the heating operation is performed at a temperature in a range from about 200 degrees C. to about 400 degrees C. The operation time may be in a range from about 30 minutes to about 2 hours. In some embodiments, the structure as shown in FIG. 1F is placed into a container mainly filled with nitrogen or other inert gas and a low concentration of oxygen, such as about 20 to about 100 ppm. The heat operation may include heating the conductive features using a furnace, a lamp, a laser, another suitable heating source, or a combination thereof.

In some embodiments, the resistivity of the conductive features 112' is lower than that of the conductive features 112. It is possible that the grain growth caused by the heating operation reduce the numbers of grain boundaries. In some embodiments, the surface morphologies of the conductive features 112' are different from those of the conductive features 112. The morphology difference may be caused by the grain growth. For example, the sidewalls of the conductive features 112' may undulate due to the grain growth after the heating operation. The morphologies of the conductive features 112' will be described in more detail later.

In some embodiments, interfacial layers 113 are formed to surround the conductive features 112' during the heating operation, in accordance with some embodiments, as shown in FIG. 1F. In some embodiments, the interfacial layer 113 is made of a metal oxide material. The interfacial layers 113 are formed due to the oxidation reaction during the heating operation.

In some embodiments, the conductive features 112' include a metal material, and the interfacial layers 113 also include the same metal material of the conductive features 112'. In some embodiments, the conductive features 112' include copper, and the interfacial layers 113 include copper oxide.

In some embodiments, each of the interfacial layers 113 are in direct contact with the corresponding one of the conductive features 112'. In some embodiments, each of the interfacial layers 113 has a thickness that is in a range from about 50 Å to about 300 Å. In some embodiments, the interfacial layer has a thickness from about 100 Å to about 200 Å.

Figure 2:
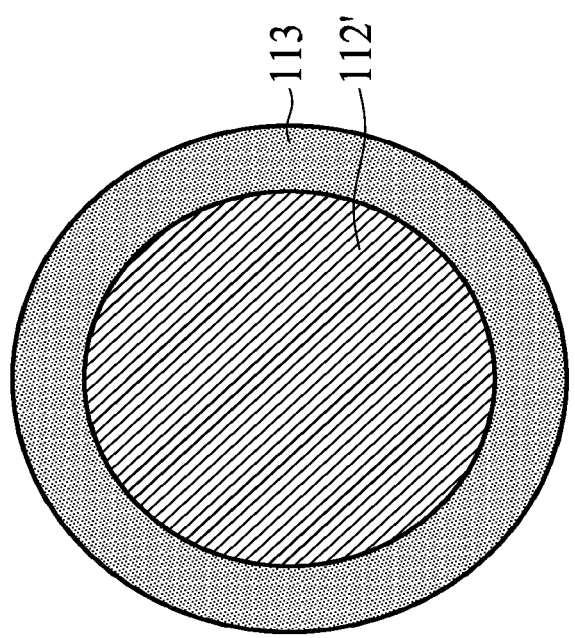
FIG. 2 is a top view of a conductive feature in a chip package, in accordance with some embodiments.

In some embodiments, each of the interfacial layers 113 continuously surrounds the corresponding one of the conductive features 112'. FIG. 2 is a top view of a conductive feature in a chip package, in accordance with some embodiments. The conductive feature 112' is continuously surrounded by the interfacial layer 113. Although the conductive feature 112' shown in FIG. 2 has a circular top view, embodiments of the disclosure are not limited thereto. The shape of the top view of the conductive feature 112' may include a circle-like shape, an oval shape, a square shape, a rectangle shape, or another suitable shape.

Figure 1G:
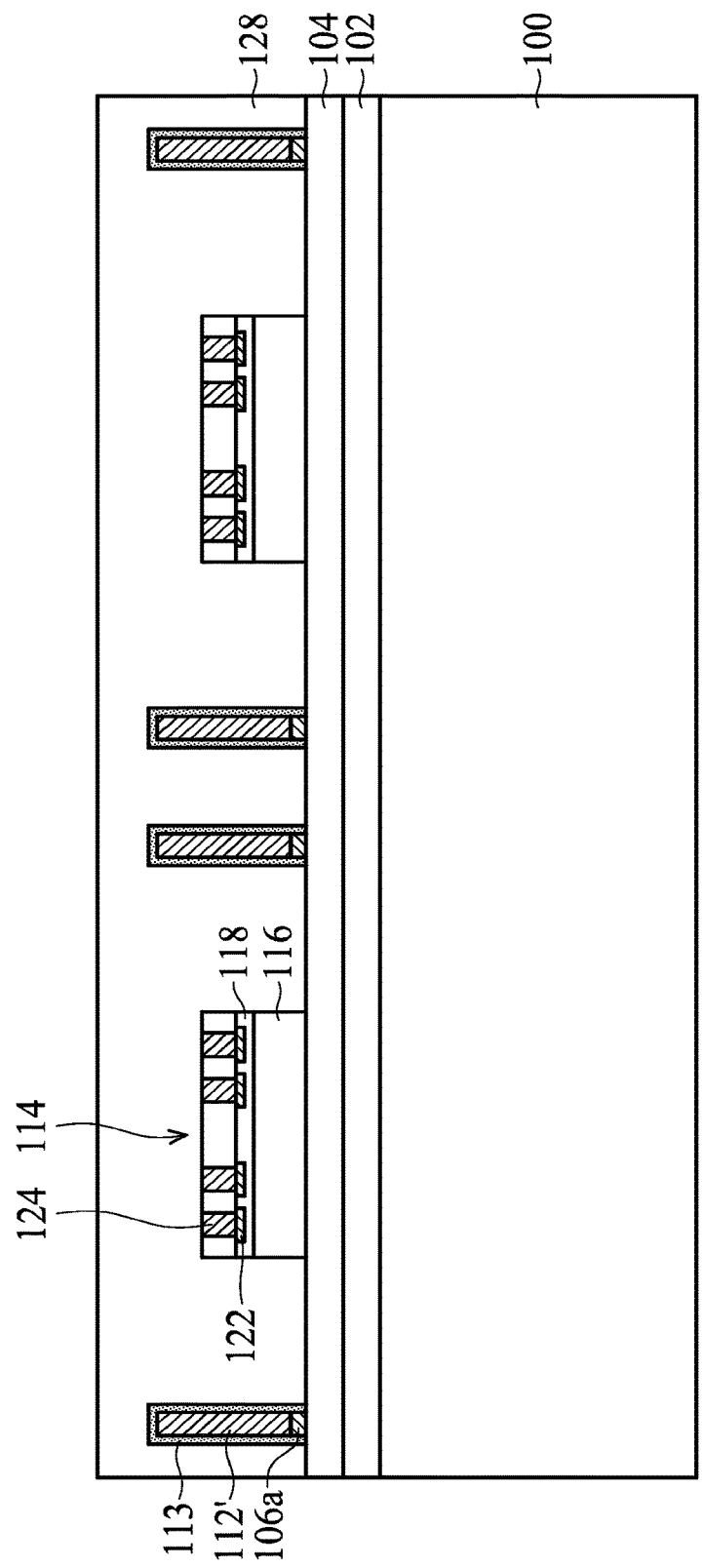

As shown in FIG. 1G, a package layer 128 is formed over the base layer 104, the conductive features 112', and the semiconductor dies 114, in accordance with some embodiments. In some embodiments, the package layer 128 includes a polymer material. In some embodiments, the package layer 128 includes a molding compound. In some embodiments, the package layer 128 encapsulates the semiconductor dies 114, including covering their top surfaces and sidewalls. In some other embodiments, the package layer 128 partially encapsulates the semiconductor dies 114. For example, upper portions of the semiconductor dies 114 protrude from the top surface of the package layer 128. In some embodiments, the package layer 128 is in direct contact with the interfacial layers 113. In some embodiments, the interfacial layers 113 separate the conductive features 112' from the package layer 128, as shown in FIG. 1G.

In some embodiments, a liquid molding compound material is applied over the base layer 104, the conductive features 112', and the semiconductor dies 114 to encapsulate the conductive features 112' and the semiconductor dies 114. In some embodiments, a thermal process is then applied to harden the molding compound material and to transform it into the package layer 128. In some embodiments, the thermal process is performed at a temperature in a range from about 200 degrees C. to about 230 degrees C. The operation time of the thermal process may be in a range from about 1 hour to about 3 hours.

The conductive features 112' have been heated to induce gram growth before the formation of the package layer 128. Since the grain size of the conductive features 112' has been increased after the previous heating operation, the subsequent thermal process for forming the package layer 128 may not induce a further grain growth of the conductive features 112'. Even if a grain growth of the conductive features 112' occurs, the further grain growth of the conductive features 112' is limited. Therefore, the morphologies of the conductive features 112' may be maintained substantially the same as those of the conductive features 112' before the thermal process. There is no high stress induced between the conductive features 112' and the package layer 128. The adhesion between the conductive features 112' and the package layer 128 can be ensured.

In some other cases, the conductive features are not heated to induce gram growth before the formation of the package layer. The thermal process for forming the package layer may induce the grain growth of the conductive features. As a result, the surface morphologies of the conductive features may be changed, which negatively affect the adhesion between the conductive features and the package layer. The reliability and performance of the chip package may therefore be reduced.

According to some embodiments of the disclosure, the conductive features 112' are heated before the formation of the package layer 128. There is substantially no stress or strain formed the package layer 128 and the interfacial layer 113 surrounding the conductive features 112' since morphology changes of the conductive features 112' is reduced or avoided. Accordingly, the interface quality between the package layer 128 and the interfacial layer 113 surrounding the conductive features 112' are improved. The reliability and performance of the chip package are therefore improved.

Figure 1H:
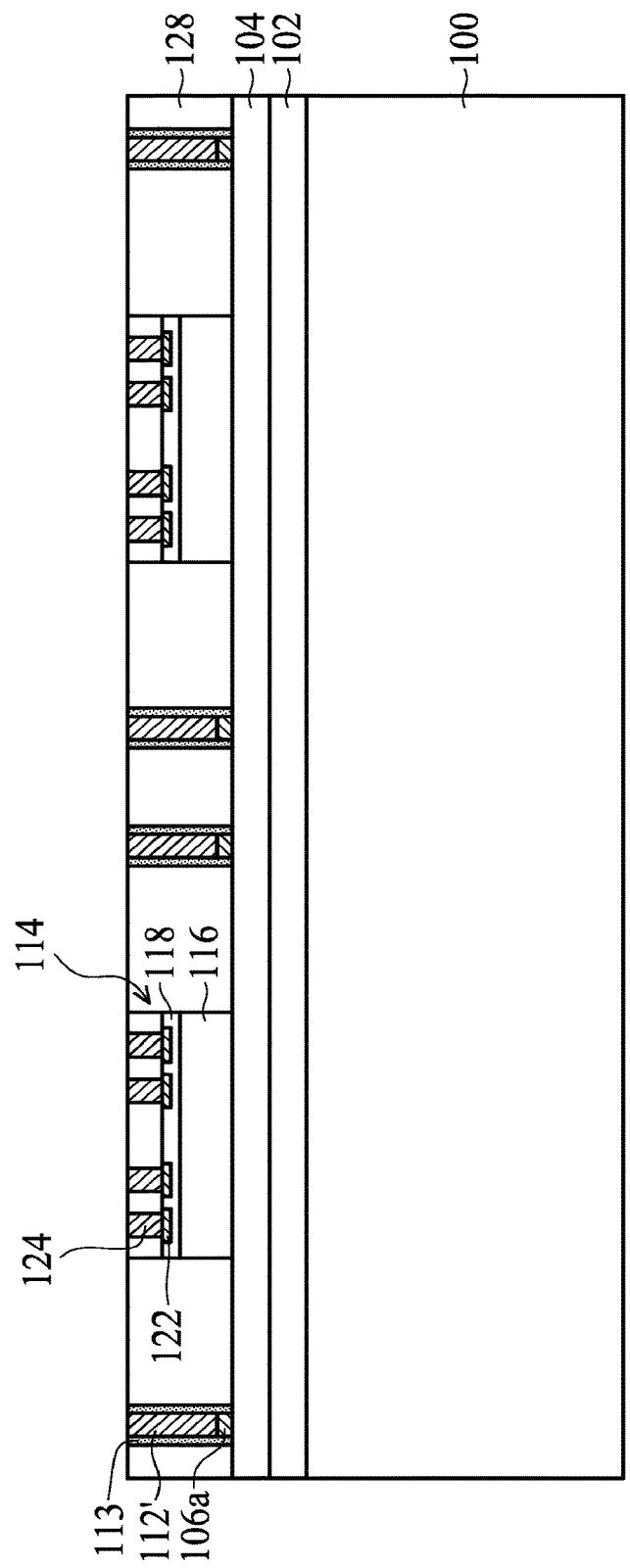

As shown in FIG. 1H, the package layer 128 is thinned to expose the connectors 124 of the semiconductor dies 114 and the conductive features 112', in accordance with some embodiments. A planarization process may be used to thin the package layer 128. The planarization process may include a grinding process, a chemical mechanical polishing (CMP) process, an etching process, another applicable process, or a combination thereof. In some embodiments, portions of the interfacial layers 113 on the tops of the conductive features 112' are removed during the planarization process, as shown in FIG. 1H. In some embodiments, upper portions of the conductive features 112' are removed during the planarization process. In some embodiments, the tops of the conductive features 112' and the connectors 124 of the semiconductor dies 114 are substantially coplanar.

Figure 1I:
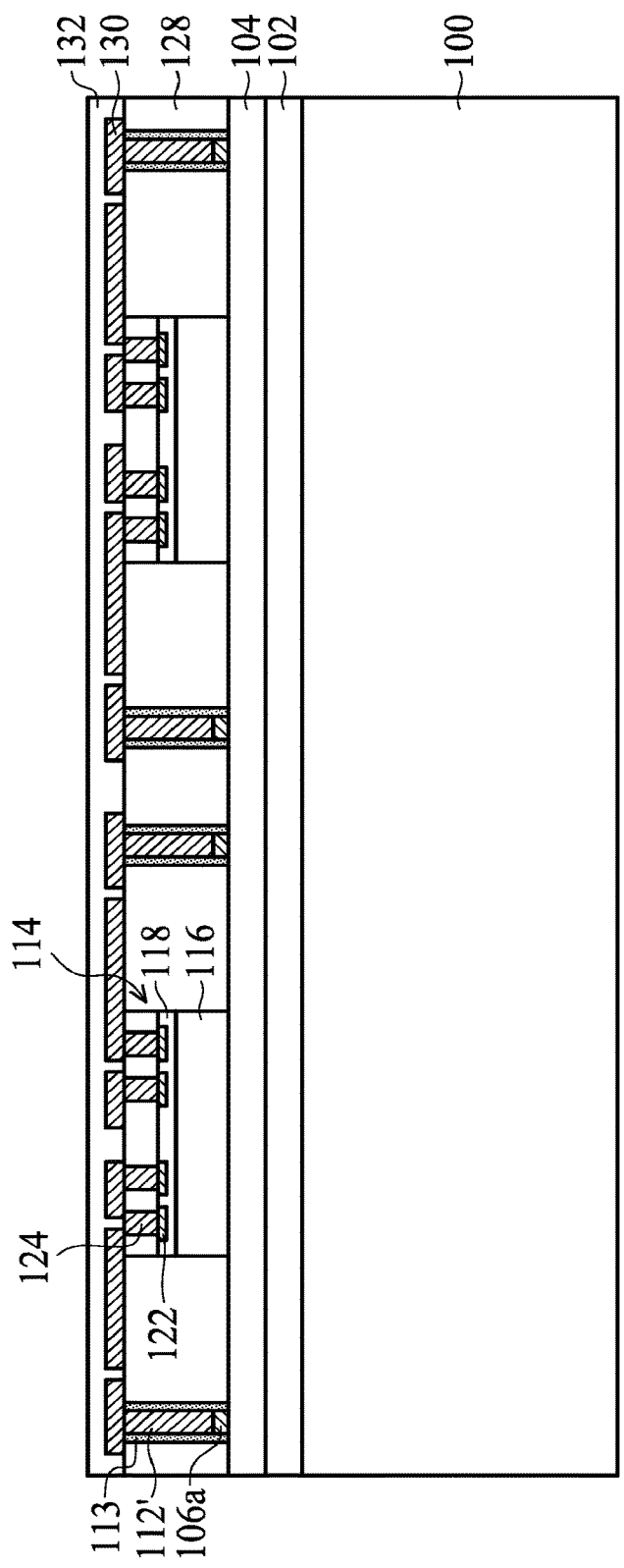

Afterwards, a redistribution structure including a redistribution layer 130 and a passivation layer 132 are formed over the structure as shown in FIG. 1H, as shown in FIG. 1I in accordance with some embodiments. The redistribution layer 130 may include multiple portions which are not electrically connected to each other. The redistribution layer 130 forms multiple electrical connections to the conductive features 112' and to the connectors 124. For example, a portion of the redistribution layer 130 is electrically connected to one of the conductive pads 122 through one of the connectors 124. A portion of the redistribution layer 130 electrically connects one of the connectors 124 to one of the conductive features 112'. A portion of the redistribution layer 130 is electrically connected to one of the conductive features 112'. The pattern of the redistribution layer 130 can be adjusted according to requirements. For example, if a different circuit layout is used to establish the connections between the conductive features 112' and the conductive pads 122, the pattern of the redistribution layer 130 may be varied accordingly. The conductive features 112 may be used as through package vias (TPVs). In some embodiments, the TPVs surround the semiconductor dies 114.

In some embodiments, the redistribution layer 130 is made of a metal material. The metal material may include copper, aluminum, tungsten, nickel, titanium, gold, platinum, another suitable material, or a combination thereof. In some embodiments, the passivation layer 132 includes one or more layers. The passivation layer 132 may have openings (not shown) exposing portions of the redistribution layer 130. Bond pads (not shown) may be formed over the exposed redistribution layer 130. The passivation layer 132 is made of dielectric material(s) and provides stress relief for bonding stress incurred during subsequent bonding processes. In some embodiments, the passivation layer 132 is made of a polymer material, such as polyimide, PBO, the like, or a combination thereof. Alternatively or additionally, the passivation layer 132 may include benzocyclobutene (BCB). In some embodiments, the passivation layer 132 includes silicon oxide, silicon oxynitride, silicon nitride, silicon carbide, another suitable material, or a combination thereof.

Multiple deposition, coating, and/or etching processes may be used to form the redistribution structure including the redistribution layer 130 and the passivation layer 132. In some embodiments, one or more thermal processes are performed during the formation the redistribution structure. For example, portions of the passivation layer 132 may be made of a polymer material that is formed using a process involving a thermal operation. As mentioned above, since the conductive features 112' have been heated to induce grain growth, the conductive features 112' may substantially maintain the morphologies after the formation of the redistribution structure. There is substantially no stress or strain formed the package layer 128 and the interfacial layer 113 surrounding the conductive features 112' since morphology changes of the conductive features 112' is reduced or avoided. The interface quality between the package layer 128 and the interfacial layer 113 surrounding the conductive features 112' are still maintained. The reliability and performance of the chip package are therefore improved.

Figure 1J:
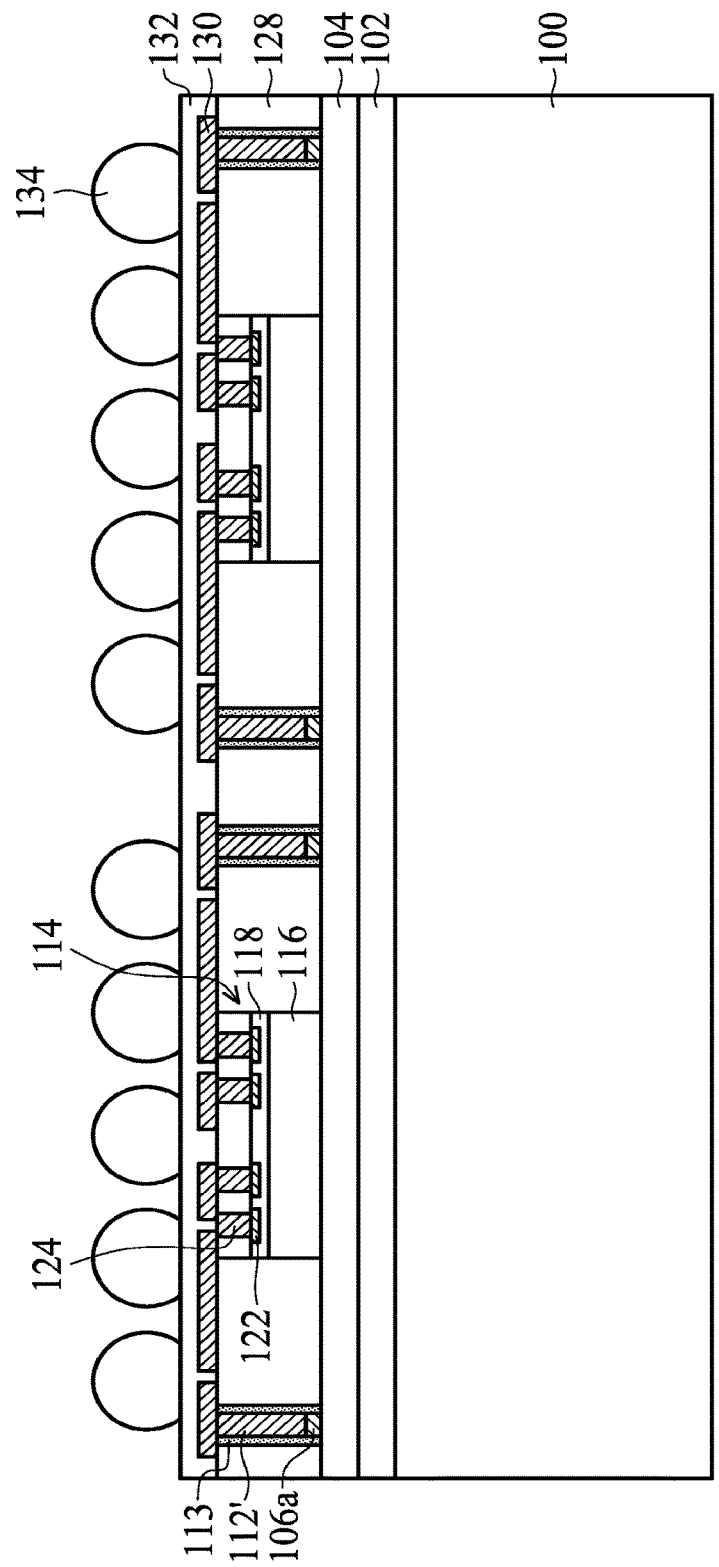

As shown in FIG. 1J, connectors 134 are formed over the passivation layer 132, in accordance with some embodiments. The connectors 134 may be mounted on (or bonded to) bond pads (not shown) of the redistribution structure through the openings (not shown) of the passivation layer 132. Some of the connectors 134 are electrically connected to one of the semiconductor dies 114 through the redistribution layer 130. Some of the connectors 134 are electrically connected to other elements through the redistribution layer 130 and one of the conductive features 112'. The connectors 134 may include solder bumps. An under bump metallurgy (UBM) layer (not shown) may be formed below the connectors 134.

Figure 1K:
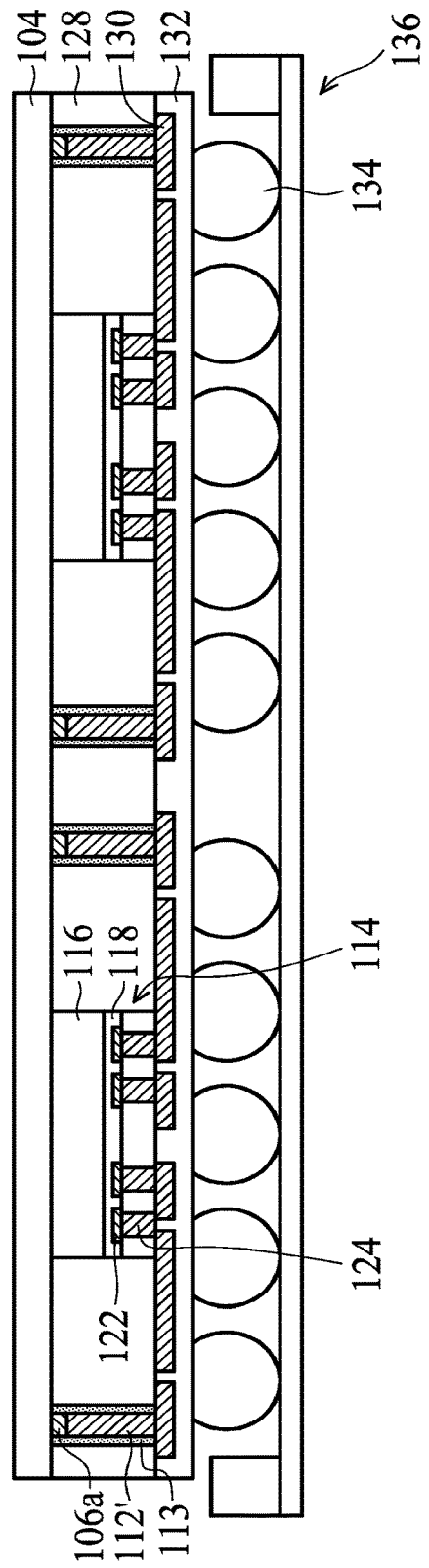

After the connectors 134 are formed, the structure as shown in FIG. 1J is flipped and attached to a carrier 136, and the carrier substrate 100 is removed, as shown in FIG. 1K in accordance with some embodiments. The carrier 136 includes a tape which is photosensitive or heat-sensitive and is easily detached from the connectors 134. In some embodiments, both the carrier substrate 100 and the adhesive layer 102 are removed. Suitable light may be provided to remove the adhesive layer 102 so as to remove the carrier substrate 100 as well.

Figure 1L:
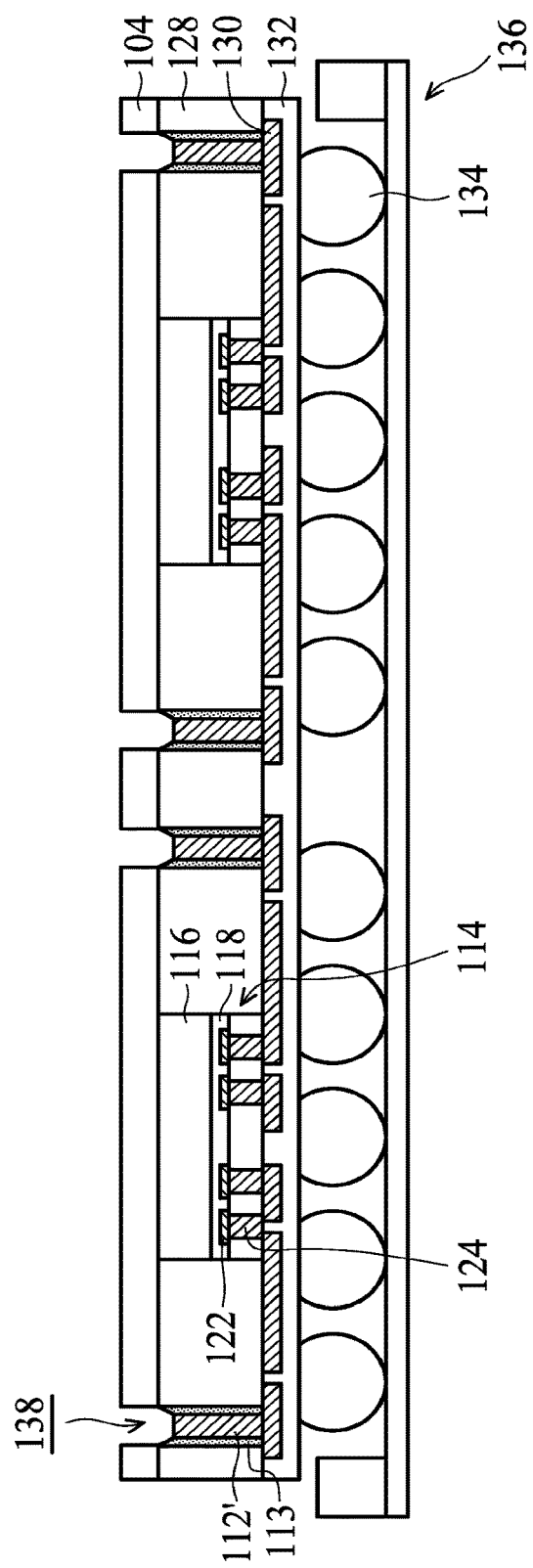

As shown in FIG. 1L, a portion of the base layer 104 is removed to form openings 138 that expose the conductive features 112', in accordance with some embodiments. In these cases, the seed elements 106a are also removed. In some other embodiments, the seed elements 106a are not removed or not completely removed. In these cases, the openings 138 expose the seed elements 106a. In some embodiments, a laser drilling process is applied to form the openings 138. Another applicable process, such as an etching process, may also be used to form the openings 138.

In some embodiments, a dicing process is performed to separate the structure as shown in FIG. 1L into multiple chip packages. In some other embodiments, more elements may be stacked on or bonded onto the structure as shown in FIG. 1L before the dicing process.

Figure 1M:
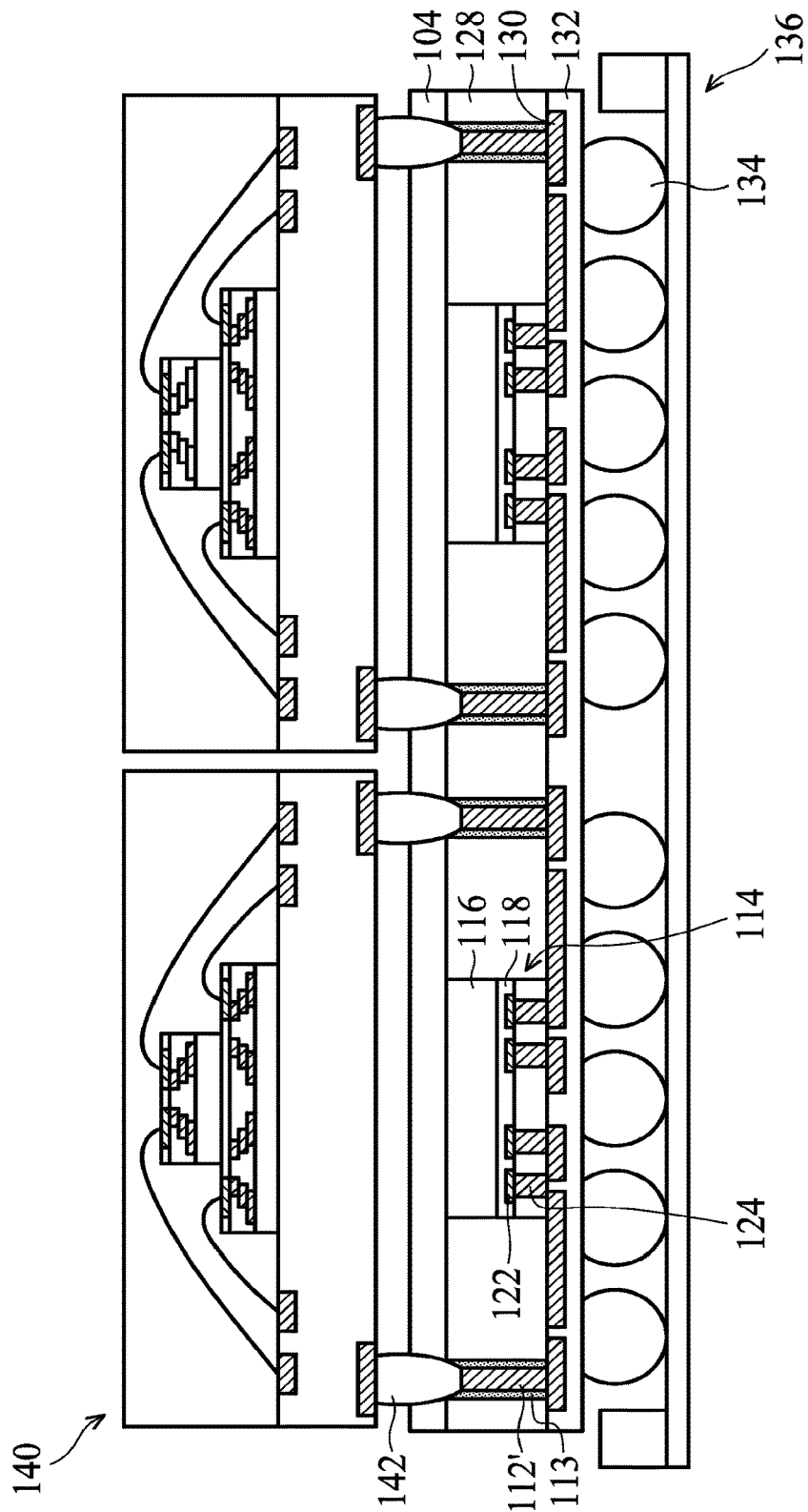
Figure 1N:
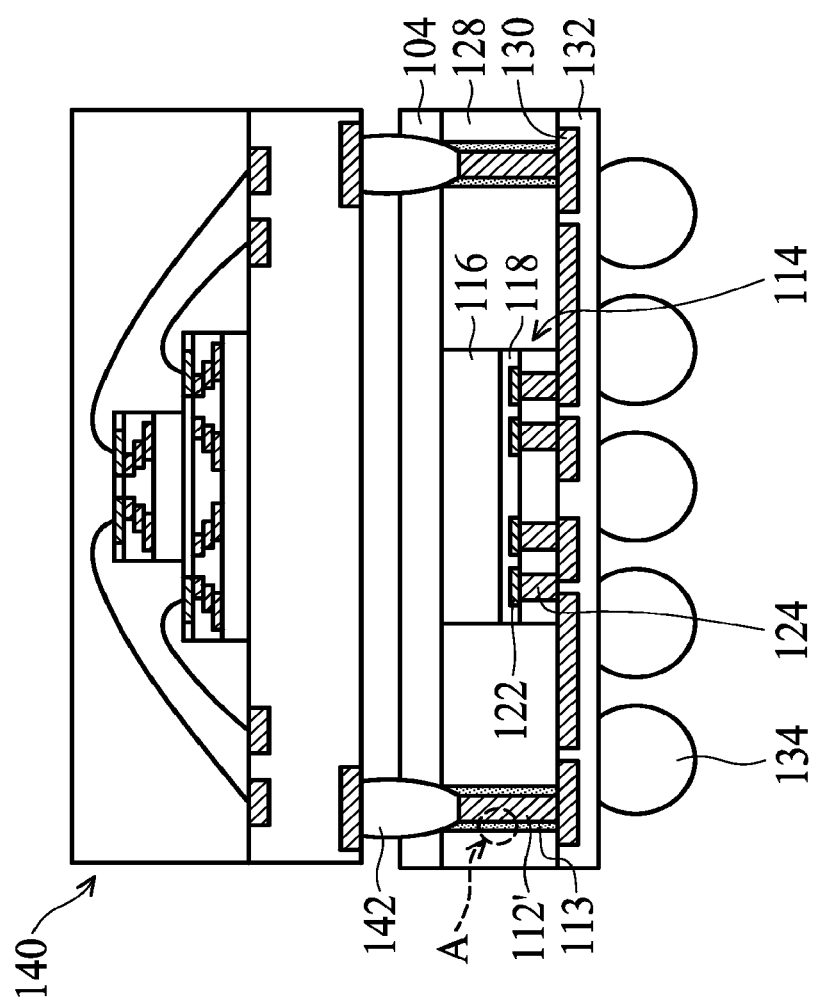

As shown in FIG. 1M, one or more elements 140 are stacked over the structure as shown in FIG. 1L, in accordance with some embodiments. In some embodiments, each of the elements 140 includes another package structure that contains one or more semiconductor dies. In some other embodiments, each of the elements 140 includes a semiconductor die.

In some embodiments, one or more connectors 142 are used to achieve the bonding between the elements 140 and the conductive features 112', as shown in FIG. 1M. Each of the connectors 142 may include a solder bump, a metal pillar, another suitable connector, or a combination thereof. In some embodiments, each of the connectors 142 is in direct contact with a corresponding one of the conductive features 112' and the interfacial layers 113.

In some embodiments, the connectors 142 are solder bumps, and the formation of the connectors 142 involves a thermal process for reflowing solder material. As mentioned above, since the conductive features 112' have been heated to induce grain growth, the conductive features 112' may substantially maintain the morphologies after the formation of the connectors 142. There is substantially no stress or strain formed between the package layer 128 and the interfacial layer 113 surrounding the conductive features 112' since morphology changes of the conductive features 112' is reduced or avoided. The interface quality between the package layer 128 and the interfacial layer 113 surrounding the conductive features 112' are still maintained. The reliability and performance of the chip package are therefore improved.

As shown in FIG. 1N, a dicing process is performed to separate the structure as shown in FIG. 1M into a number of chip packages separated from each other, in accordance with some embodiments. As shown in FIG. 1N, one of the chip packages is shown in FIG. 1N. In some embodiments, the carrier 136 is removed.

Many variations and/or modifications can be made to embodiments of the disclosure. For example, although the embodiments shown in FIGS. 1A-1N provide a chip package having a "fan-out" feature, embodiments of the disclosure are not limited thereto. Some other embodiments of the disclosure include chip packages having a "fan-in" feature.

Many variations and/or modifications can be made to embodiments of the disclosure. For example, although the conductive features are heated after the semiconductor dies are disposed over the carrier substrate, embodiments of the disclosure are not limited thereto. In some embodiments, the conductive features are heated before the semiconductor dies are disposed over the carrier substrate.

Figure 3A:
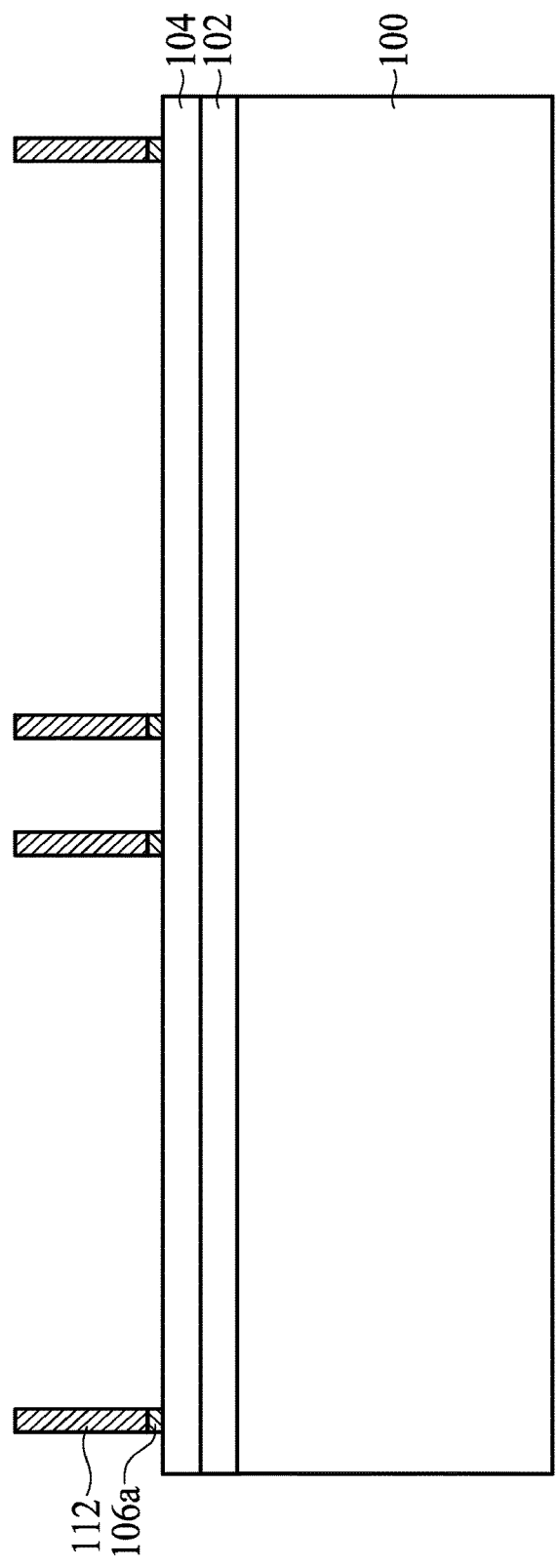
FIGS. 3A-3C are cross-sectional views of various stages of a process for forming a chip package, in accordance with some embodiments.
Figure 3B:
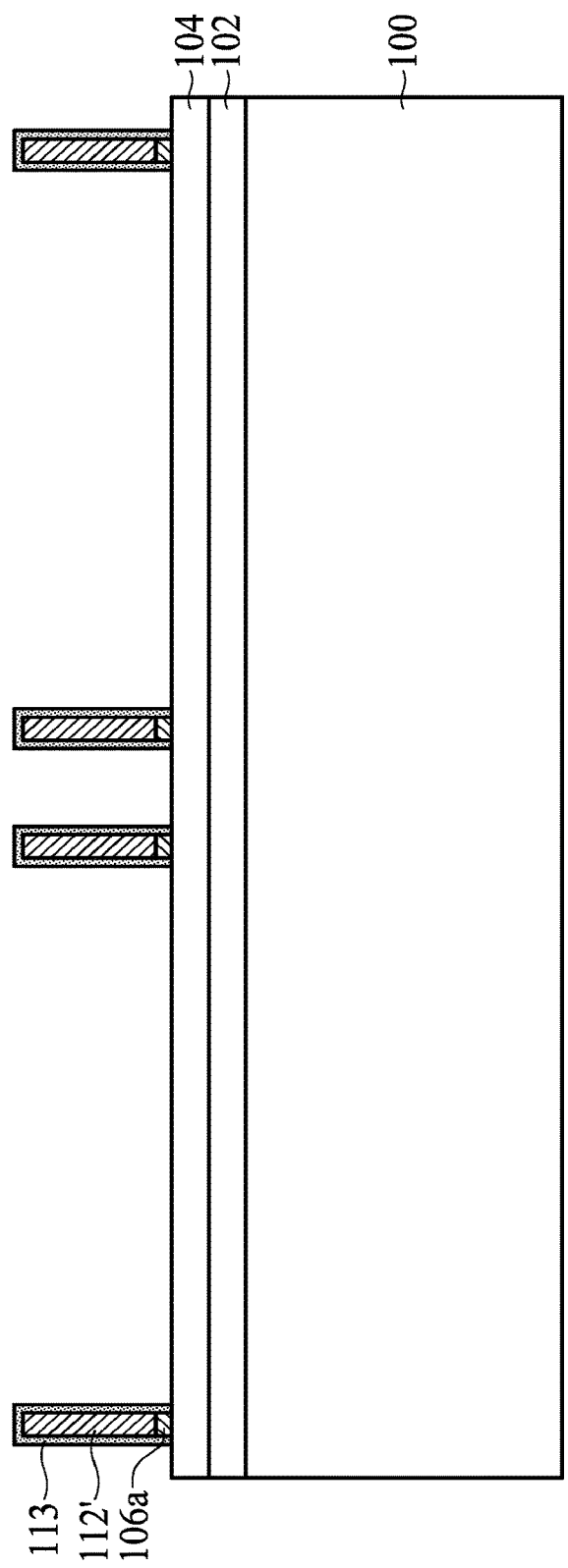
Figure 3C:
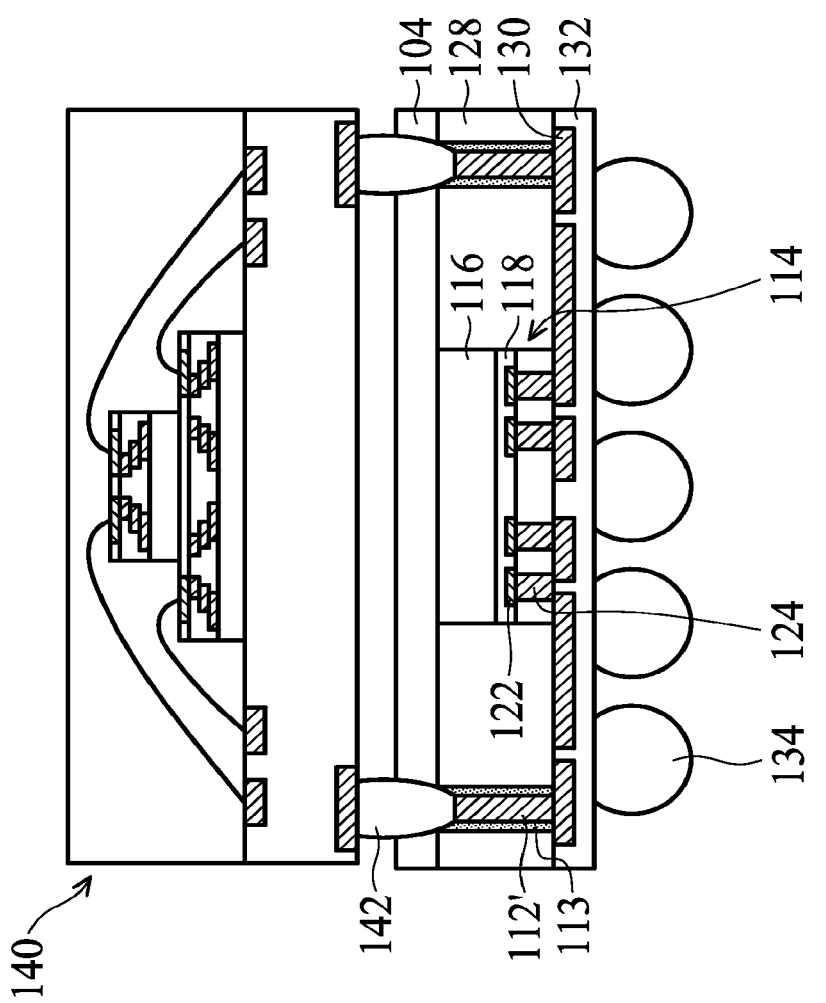

FIGS. 3A-3C are cross-sectional views of various stages of a process for forming a chip package, in accordance with some embodiments. As shown in FIG. 3A, a structure similar to that shown in FIG. 1D is provided. Afterwards, the conductive features 112 are heated to form the conductive features 112', as shown in FIG. 3B in accordance with some embodiments. As mentioned above, the heating operation may cause grains of the conductive features 112' to grow larger. Afterwards, similar to that shown in FIG. 1E, the semiconductor dies 114 are disposed over the carrier substrate 100. Thereafter, multiple processes similar to those shown in FIGS. 1G-1N are performed. As a result, the chip package is formed, as shown in FIG. 3C.

Figure 4:
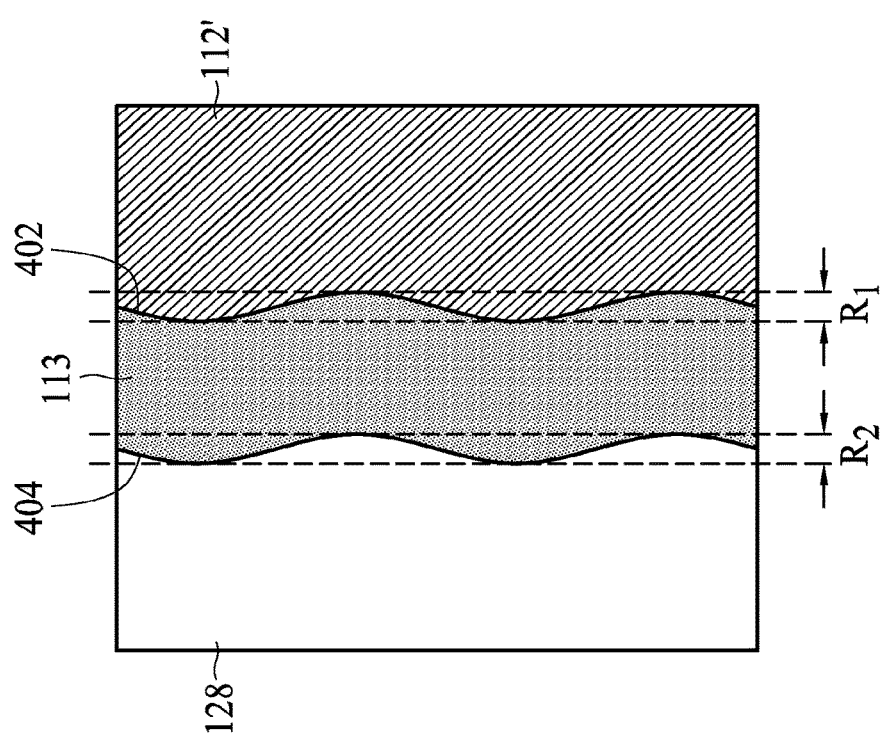
FIG. 4 is a cross-sectional view of a portion of a chip package, in accordance with some embodiments.

As mentioned above, the sidewalls of the conductive features 112' may undulate due to the grain growth after the heating operation. FIG. 4 is a cross-sectional view of a portion of a chip package, in accordance with some embodiments. In some embodiments, FIG. 4 is an enlarged cross-sectional view of the region A shown in FIG. 1N.

As shown in FIG. 4, the sidewall of one of the conductive features 112' has an undulate morphology, in accordance with some embodiments. The undulate morphology may be caused due to the grain growth inside the conductive features 112'. In some embodiments, a height variation $R_1$ between a highest portion and lowest portion of the sidewall of one of the conductive features 112' is in a range from about 10 nm to about 130 nm. In some embodiments, the conductive features 112' are made of electroplated bright copper. In these cases, the height variation of the sidewall of one of the conductive features 112' may be in a range from about 10 nm to about 20 nm.

In some embodiments, the interfacial layers 113 are in direct contact with the conductive features 112'. The interface 402 between one of the conductive features 112' and one of the interfacial layers 113 also has an undulate morphology. In some embodiments, the interfacial layers 113 are conformal layers. As a result, the interface 404 between one of the interfacial layers 113 and the package layer 128 also has an undulate morphology. In some embodiments, a height variation $R_2$ between a highest portion and lowest portion of the interface 404 is substantially the same as the height variation $R_1$. In some embodiments, the interface 404 is substantially parallel to the interface 402.

In some embodiments, there is no gap formed between the interfacial layers 113 and the package layer 128. However, embodiments of the disclosure are not limited thereto. In some cases, there might be small gaps formed between the interfacial layer 113 and the package layer 128. FIG. 5 is a cross-sectional view of a portion of a chip package, in accordance with some embodiments. In some embodiments, FIG. 5 is an enlarged cross-sectional view of the region A shown in FIG. 1N.

In some embodiments, a gap G is formed between the interfacial layer 113 and the package layer 128. Because the conductive features 112' are preheated to induce the grain growth, the stress or stain between the conductive features 112' and the package layer 128 is reduced. Therefore, the gap G can be controlled to be small. In some embodiments, the width W of the gap is smaller than the height variation $R_1$ or $R_2$.

Embodiments of the disclosure provide structures and formation methods of chip packages. The chip package includes conductive features penetrating through a package layer, such as a molding compound, which encapsulates one or more semiconductor dies. The conductive features are heated to induce grain growth before the formation of the package layer. Therefore, thermal operations during the subsequent formation of the package layer or other elements of the chip package substantially do not induce further grain growth of the conductive features or causing high stress. The conductive features may substantially maintain the morphologies after the subsequent thermal operations. There is substantially no stress or strain formed in the package layer and the conductive features since morphology changes of the conductive features is reduced or avoided. The interface quality between the package layer and the interface the conductive features are therefore maintained. The reliability and performance of the chip package are improved significantly.

In accordance with some embodiments, a chip package is provided. The chip package includes a semiconductor die and a package layer partially or completely encapsulating the semiconductor die. The chip package also includes a conductive feature in the package layer. The chip package further includes an interfacial layer between the conductive feature and the package layer. The interfacial layer is made of a metal oxide material.

In accordance with some embodiments, a chip package is provided. The chip package includes a semiconductor die and a package layer partially or completely encapsulating the semiconductor die. The chip package also includes a conductive feature penetrating through the package layer. The chip package further includes an interfacial layer continuously surrounding the conductive feature. The interfacial layer is between the conductive feature and the package layer, and the interfacial layer is made of a metal oxide material.

In accordance with some embodiments, a method for forming a chip package is provided. The method includes forming a conductive feature over a carrier substrate and disposing a semiconductor die over the carrier substrate. The method also includes forming a package layer over the carrier substrate to at least partially encapsulate the semiconductor die and the conductive feature. The method further includes heating the conductive feature before the formation of the package layer.

One general aspect of embodiments disclosed herein includes a chip package, including a molding compound at least partially encapsulating a semiconductor die, and a conductive feature extending through the molding compound. The conductive feature has undulating sidewalls and an interfacial layer contacting the undulating sidewalls.

Another general aspect of embodiments disclosed herein includes a method for forming a chip package, including forming a conductive feature over a carrier substrate. The conductive feature has an average grain size. The method includes heating the conductive feature to increase the average grain size to a larger average grain size, where heating forms an interfacial layer on sidewalls of the conductive feature. The method further includes forming a package layer at least partially encapsulating the conductive feature.

Yet another general aspect of embodiments disclosed herein includes a packaged device including a package layer and an element extending through the package layer. The element includes an inner region composed of a metal, and an outer region composed of an oxide of the metal. The element has an undulating sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package comprising:
    a molding compound at least partially encapsulating a semiconductor die;
    a conductive feature extending through the molding compound, the conductive feature having undulating sidewalls; and
    an interfacial layer having a first surface and a second surface opposite the first surface, the first surface contacting the undulating sidewalls of the conductive feature, a first portion of the second surface being in physical contact with the molding compound, a second portion of the second surface being spaced apart from the molding compound.

2. The chip package of claim 1, wherein the undulating sidewalls of the conductive feature have a first height variation between a highest portion and a lowest portion of respective sidewalls, and wherein the second surface of the interfacial layer has a second height variation between a highest portion and a lowest portion of the second surface.

3. The chip package of claim 2, wherein the first height variation and the second height variation are substantially the same.

4. The chip package of claim 1, wherein the conductive feature is a metal and the interfacial layer is an oxide of the metal.

5. The chip package of claim 4, wherein the metal comprises copper.

6. The chip package of claim 1, wherein the interfacial layer has undulating sidewalls at the second surface.

7. A method for forming a chip package, the method comprising:
    forming a conductive feature over a carrier substrate, the conductive feature having an average grain size;
    heating the conductive feature to increase the average grain size to a larger average grain size, wherein heating forms an interfacial layer on sidewalls of the conductive feature; and
    forming a package layer at least partially encapsulating the conductive feature, wherein forming the package layer forms at least one gap between the package layer and the interfacial layer.

8. The method of claim 7, wherein forming the conductive feature comprises:
    depositing a seed layer on a base layer;
    forming a patterned mask layer over the seed layer;
    plating a metal in openings in the patterned mask layer to form the conductive feature;
    removing the patterned mask layer; and
    removing portions of the seed layer left exposed by removal of the patterned mask layer.

9. The method of claim 7, wherein heating the conductive feature is performed at a temperature in a range of from about 200 degrees C. to about 400 degrees C.

10. The method of claim 7, wherein heating the conductive feature causes the conductive feature to have an undulating surface.

11. The method of claim 7, wherein the conductive feature is a metal and the interfacial layer is an oxide of the metal.

12. The method of claim 7, wherein forming the package layer at least partially encapsulating the conductive feature comprises:
encapsulating the conductive feature in a molding compound.

13. The method of claim 12, wherein encapsulating the conductive feature in a molding compound forms an undulating interface between the molding compound and the interfacial layer.

14. A packaged device comprising:
a package layer; and
an element extending through the package layer, the element comprising:
an inner region composed of a metal, and
an outer region composed of an oxide of the metal, the outer region of the element and the inner region of the element forming a first interface having an undulating shape;
wherein the package layer comprises a molding compound surrounding the element, the molding compound and the outer region of the element forming a second interface having an undulating shape, wherein the undulating shape of the first interface and the second interface have a same height variation.

15. The packaged device of claim 14, wherein the element is a copper through via extending through the molding compound.

16. The packaged device of claim 14, further comprising:
an integrated circuit die encapsulated in the molding compound.

17. The packaged device of claim 14, further comprising:
a redistribution layer electrically contacting one end of the element and a connector electrically contacting another end of the element.

18. The packaged device of claim 14, wherein the inner region of the element is a conductive material and the outer region of the element is an oxide of the conductive material.

19. The chip package of claim 6, wherein a first height variation of the undulating sidewalls of the conductive feature is equal to a second height variation of the undulating sidewalls of the interfacial layer.

20. The method of claim 13, wherein heating the conductive feature forms an undulating interface between the conductive feature and the interfacial layer.

* * * * *